(12) United States Patent
Minami

(10) Patent No.: US 10,355,077 B2
(45) Date of Patent: Jul. 16, 2019

(54) SEMICONDUCTOR DEVICE

(71) Applicant: SII Semiconductor Corporation, Chiba-shi, Chiba (JP)

(72) Inventor: Yukimasa Minami, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/715,905

(22) Filed: Sep. 26, 2017

(65) Prior Publication Data

US 2018/0090563 A1    Mar. 29, 2018

(30) Foreign Application Priority Data

Sep. 28, 2016    (JP) .................................. 2016-190175

(51) Int. Cl.
| | |
|---|---|
| *H01L 29/78* | (2006.01) |
| *H01L 29/06* | (2006.01) |
| *H01L 29/10* | (2006.01) |
| *H01L 29/66* | (2006.01) |
| *H01L 27/02* | (2006.01) |
| *H01L 29/861* | (2006.01) |
| *H01L 29/423* | (2006.01) |

(52) U.S. Cl.
CPC ...... *H01L 29/0626* (2013.01); *H01L 27/0248* (2013.01); *H01L 29/1045* (2013.01); *H01L 29/66681* (2013.01); *H01L 29/7816* (2013.01); *H01L 29/7834* (2013.01); *H01L 29/7835* (2013.01); *H01L 29/861* (2013.01); *H01L 29/1087* (2013.01); *H01L 29/42368* (2013.01)

(58) Field of Classification Search
CPC ............. H01L 27/0248; H01L 29/7835; H01L 27/0266
See application file for complete search history.

(56) References Cited

U.S. PATENT DOCUMENTS

| | | |
|---|---|---|
| 2004/0051158 A1 | 3/2004 | Kikuchi et al. |
| 2010/0078721 A1* | 4/2010 | Fujii ................... H01L 29/0653 257/344 |

FOREIGN PATENT DOCUMENTS

JP    2004-031805 A    1/2004

* cited by examiner

*Primary Examiner* — Mark V Prenty
(74) *Attorney, Agent, or Firm* — Brinks Gilson & Lione

(57) ABSTRACT

In an ESD protection element configured to protect a semiconductor device, a first N-type low concentration diffusion layer is formed, as an offset layer for easing electric field concentration, under a LOCOS oxide film formed at each end of the gate electrode, and a second N-type low concentration diffusion layer and a third low concentration diffusion layer are formed under an N-type high concentration diffusion layer on the drain side to set the point of breakdown at a level deep inside a substrate from a surface of the substrate. The hold voltage is thus raised to a voltage equal to or higher than the operating voltage and a noise can be relieved without increasing the element size of the ESD protection element even when the noise having a large amount of positive electric charge is applied to a Vdd supply terminal.

4 Claims, 6 Drawing Sheets

US 10,355,077 B2
// 1

SEMICONDUCTOR DEVICE

RELATED APPLICATIONS

This application claims priority under 35 U.S.C. § 119 to Japanese Patent Application No. 2016-190175 filed on Sep. 28, 2016, the entire content of which is hereby incorporated by reference.

BACKGROUND OF THE INVENTION

1. Field of the Invention

The present invention relates to an ESD protection element configured to prevent the breakdown of a semiconductor device having a high withstanding voltage from a surge and noise, typically, electrostatic discharge.

2. Description of the Related Art

A semiconductor device is provided with an electrostatic discharge (hereinafter abbreviated as ESD) protection element in order to protect internal elements from various surges and noises, typically, ESDs. Examples of the ESD protection element include diode elements, bipolar elements, and thyristor elements that are configured independently or parasitically. A diode, bipolar, or thyristor element as an ESD protection element in a semiconductor device is required to have a function that keeps the element turned off in a steady state, puts the element into operation before internal elements reach breakdown from a surge or noise applied to the semiconductor device to discharge a large current generated by the surge or the noise, and then turns the element back off.

Other common ESD protection elements include NMOS off transistors. An NMOS off transistor of the related art is illustrated in FIG. 2. The NMOS off transistor is formed on a P-type semiconductor substrate 11, and has a gate electrode 33 on a gate insulating film 22 which is formed on the P-type semiconductor substrate 11. An N-type high concentration diffusion layer 15a is connected to a drain electrode 31. An N-type high concentration diffusion layer 15b which serves as a source, and a P-type high concentration diffusion layer 16 which is used to acquire the potential of the P-type semiconductor substrate 11, are connected to a source-substrate electrode 32. The N-type high concentration diffusion layer 15b and the P-type high concentration diffusion layer 16 are electrically junctioned to the gate electrode 33, and are connected to a Vss potential. The drain electrode 31 is connected to a Vdd supply terminal, an input/output terminal, or other terminals.

The NMOS off transistor of the related art is structured so that a negative surge or noise applied to the drain electrode 31 causes a forward bias in a P-N junction between the N-type high concentration diffusion layer 15a and the P-type semiconductor substrate 11, thereby releasing electric charges to Vss, and so that a positive surge or noise applied to the drain electrode 31 causes a reverse bias and resultant surface breakdown, and a parasitic NPN bipolar transistor is activated between the source-substrate-drain by a current flowing in the P-type semiconductor substrate 11, with the result that a large current is released to Vss. In the parasitic NPN bipolar operation described above, it is important to set the hold voltage equal to or higher than a maximum operating voltage applied to the semiconductor device in order to turn off the NMOS off transistor without fail after the surge or the noise is relieved. The hold voltage in the structure of the related art can be set by adjusting an L length which is the channel length of the NMOS off transistor.

When the semiconductor device to be protected is high in withstanding voltage, the NMOS off transistor is naturally required to be high in surface breakdown voltage and hold voltage. A common NMOS off transistor in which a drain electrode has a high withstanding voltage structure is illustrated in FIG. 3. This NMOS off transistor is formed on a P-type semiconductor substrate 11, and has a gate electrode 33 on a gate insulating film 22 which is formed on the P-type semiconductor substrate 11. Each end of the gate electrode 33 has a LOCOS off set structure which includes one of LOCOS oxide films 21a and 21b and one of N-type low concentration diffusion layers 13a and 13b. The N-type low concentration diffusion layers 13a and 13b are offset layers. An N-type high concentration diffusion layer 15a is connected to a drain electrode 31. An N-type high concentration diffusion layer 15b which serves as a source and a P-type high concentration diffusion layer 16, which is used to acquire the potential of the P-type semiconductor substrate 11, are connected to a source-substrate electrode 32. The N-type high concentration diffusion layer 15b and the P-type high concentration diffusion layer 16 are electrically junctioned to the gate electrode 33, and are connected to a Vss potential. The drain electrode 31 is connected to a Vdd supply terminal or an input/output terminal. LOCOS oxide films 21c and 21d for element isolation are arranged along the perimeter of the NMOS off transistor. An N-type low concentration diffusion layer 13c and a P-type low concentration diffusion layer 14 are formed under the LOCOS oxide films 21c and 21d, respectively (see Japanese Patent Application Laid-open No. 2004-031805, for example).

The semiconductor substrate concentration cannot be very high because the surface breakdown withstanding voltage from the viewpoint of the drain electrode and the junction withstanding voltage in the junction between the drain electrode and the semiconductor substrate need to be raised. This tendency is more prominent when the required withstanding voltage is higher. The concentration of the P-type semiconductor substrate 11 is very low also in the NMOS off transistor of FIG. 3, which is a protection element for high withstanding voltage. In other words, the P-type semiconductor substrate 11 has high resistance, which means that, when a positive surge or noise is applied to the drain electrode 31, electrons generated from surface breakdown easily raise the potential of portions of the P-type semiconductor substrate 11 that are under the N-type high concentration diffusion layer 15b and the N-type low concentration diffusion layer 13b. The rise in potential lowers the threshold for the activation of the parasitic NPN bipolar transistor, with the result that the hold voltage is made very low.

The drop in hold voltage can be prevented by, as illustrated in FIG. 4, forming an N-type well diffusion layer 12 in the N-type high concentration diffusion layer 15a on the drain side, and setting a concentration gradient toward the N-type high concentration diffusion layer 15a on the drain side from a channel end in a manner that eases electric field concentration in the N-type high concentration diffusion layer 15a. As a result, the rise in potential of the P-type semiconductor substrate 11 can be prevented. It is a common practice to share the N-type well diffusion layer 12 with a well of a PMOS transistor of the internal element. Owing to well diffusion, the concentration of the N-type well diffusion layer 12 is relatively high near the surface of the P-type semiconductor substrate 11 and decreases as the distance from the surface to the interior of the P-type semiconductor substrate 11 grows.

When an intense positive surge or noise is applied to the VDD terminal in this structure, the N-type well diffusion layer 12 formed under the N-type high concentration diffusion layer 15a and the LOCOS film on the drain side may successfully ease the electric field concentration, thereby preventing the potential of the P-type semiconductor substrate 11 from rising and temporarily ensuring that the hold voltage is equal to or higher than the operating voltage (breakdown occurring at this point is hereinafter referred to as "primary breakdown"). However, electrons generated in the primary breakdown pass through a region on a surface of the N-type low concentration diffusion layer 13a in which the concentration is enhanced by the presence of the N-type well diffusion layer 12 under the LOCOS film and is accordingly highest, and easily shift the point of electron concentration to a border between the high concentration region on the surface of the N-type low concentration diffusion layer 13a and the N-type high concentration diffusion layer 15a.

Consequently, breakdown occurs at the border between the N-type high concentration diffusion layer 15a and the high concentration region on the surface of the N-type low concentration diffusion layer on the drain side (breakdown occurring at this point is hereinafter referred to as "secondary breakdown"). The electron concentration raises the potential of the P-type semiconductor substrate 11 that much higher in the secondary breakdown than in the primary breakdown. The threshold for the activation of the parasitic NPN bipolar transistor is lowered as a result. In conclusion, even with the structure of FIG. 4, the hold voltage is not prevented from dropping to a very low level. A current-voltage waveform in this case is shown in FIG. 6.

FIG. 6 is a graph for showing a TLP current-voltage waveform of the semiconductor device of the related art. The waveform of FIG. 6 indicates, by way of the drain current, the state of the NMOS off transistor that is observed when a current is injected to the drain electrode of the NMOS off transistor, in other words, when an intense positive surge or noise is applied to the VDD terminal as described above. Even when a W length of the NMOS off transistor is extended so that the amount of current that flows in the NMOS off transistor increases, the hold voltage after the primary breakdown is maintained, but the size of the NMOS off transistor increases.

The hold voltage can be adjusted also by changing the L length which is the channel length of the NMOS off transistor, or the LOCOS offset length as in existing methods. The existing methods, however, lead to an increase in size of the NMOS off transistor.

SUMMARY OF THE INVENTION

The present invention provides an ESD protection element that fulfills a required function without increasing an element size in a semiconductor device having high withstanding voltage.

To attain the object described above, one embodiment of the present invention uses the following measures.

A semiconductor device includes:
a P-type semiconductor substrate;
a gate insulating film placed on a surface of the P-type semiconductor substrate;
a gate electrode placed on the gate insulating film;
a LOCOS oxide film placed on the surface of the P-type semiconductor substrate at each end of the gate electrode;
a first N-type low concentration diffusion layer of a source and a first N-type low concentration diffusion layer of a drain, the first N-type low concentration diffusion layers being placed under the LOCOS oxide films;
an N-type high concentration diffusion layer of the source and an N-type high concentration diffusion layer of the drain, the N-type high concentration diffusion layer of the source being placed in contact with the first N-type low concentration diffusion layer of the source on an opposite side from the gate insulating film, the N-type high concentration diffusion layer of the drain being placed in contact with the first N-type low concentration diffusion layer of the drain on an opposite side from the gate insulating film;
a second N-type low concentration diffusion layer placed under the first N-type low concentration diffusion layer of the drain and the N-type high concentration diffusion layer of the drain; and
a third N-type low concentration diffusion layer placed under the second N-type low concentration diffusion layer.

In the semiconductor device, the third N-type low concentration diffusion layer has a concentration higher than a concentration of the first N-type low concentration diffusion layer and a concentration of the second N-type low concentration diffusion layer, and the concentration of the second N-type low concentration diffusion layer is equal to or higher than the concentration of the first N-type low concentration diffusion layer.

In the semiconductor device, the third N-type low concentration diffusion layer is at a depth that is about ¼ of a length of the first N-type low concentration diffusion layers.

In the ESD protection element configured to protect a semiconductor device that is high in withstanding voltage from noise or a surge, the first N-type low concentration diffusion layer is formed, as an offset layer for easing the electric field concentration, under the LOCOS oxide film formed at each end of the gate electrode, and the second N-type low concentration diffusion layer and the third low concentration diffusion layer are formed under the N-type high concentration diffusion layer on the drain side to set the point of breakdown at a level deep inside the substrate from the surface of the substrate. The hold voltage is thus set to a voltage equal to or higher than the operating voltage and, even when noise having a large amount of positive electric charge is applied to the Vdd supply terminal, the noise can be relieved without increasing the element size.

DETAILED DESCRIPTION OF THE PREFERRED EMBODIMENTS

Figure 1:
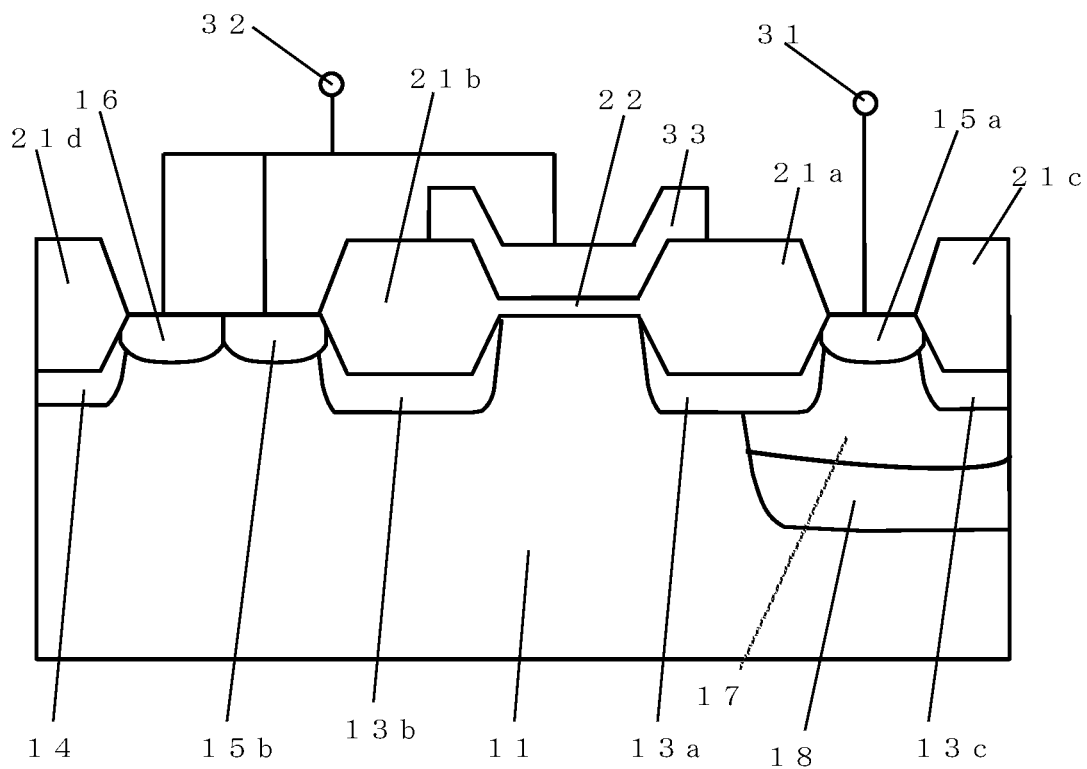
FIG. 1 is a schematic sectional view for illustrating a semiconductor device according to an embodiment of the present invention.
Figure 2:
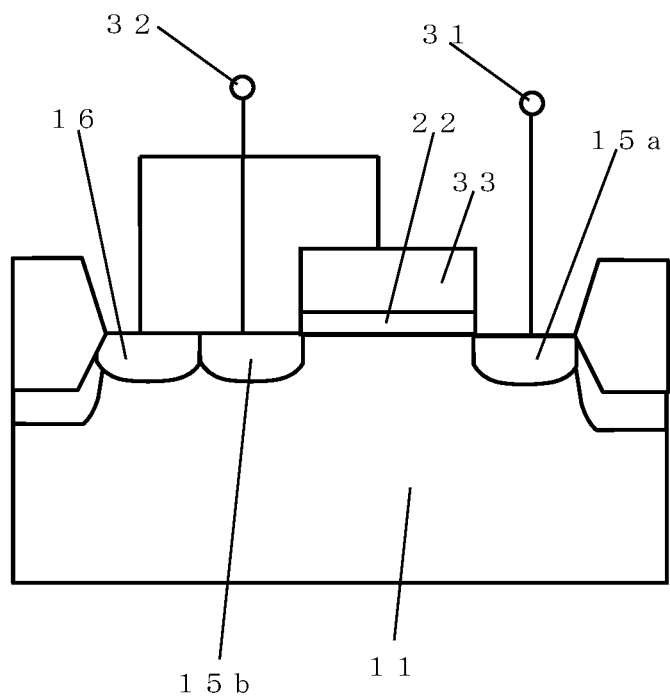
FIG. 2 is a schematic sectional view for illustrating a semiconductor device of the related art.
Figure 3:
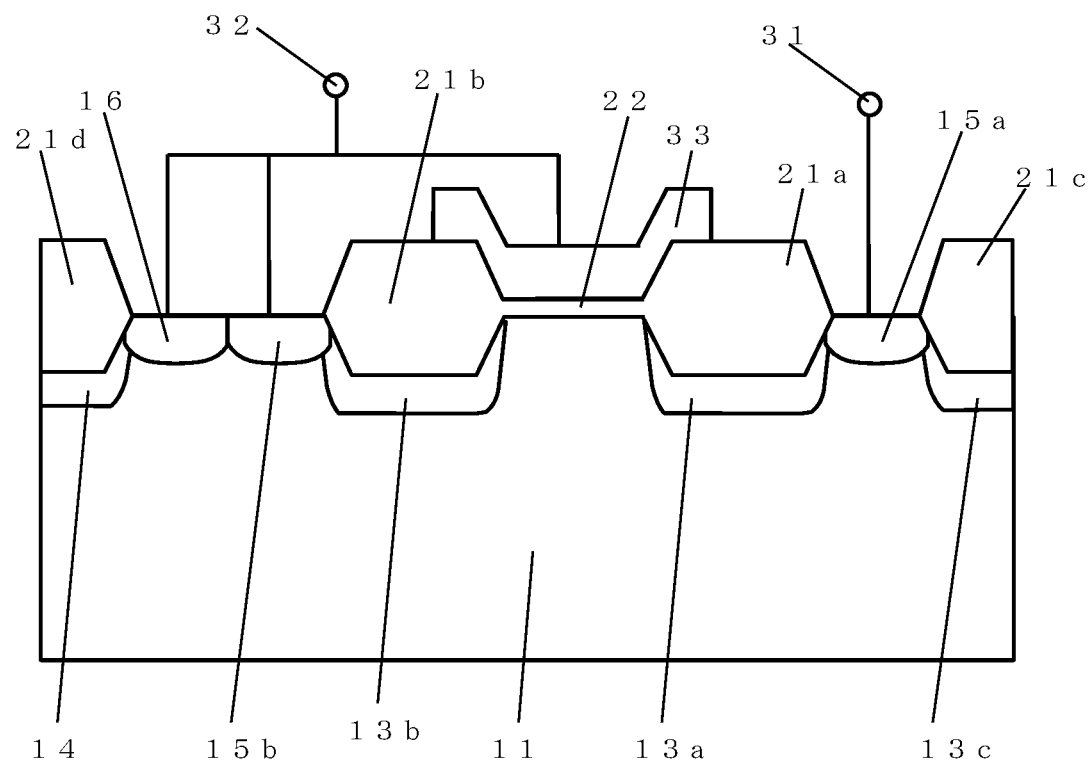
FIG. 3 is a schematic sectional view for illustrating another semiconductor device of the related art.
Figure 4:
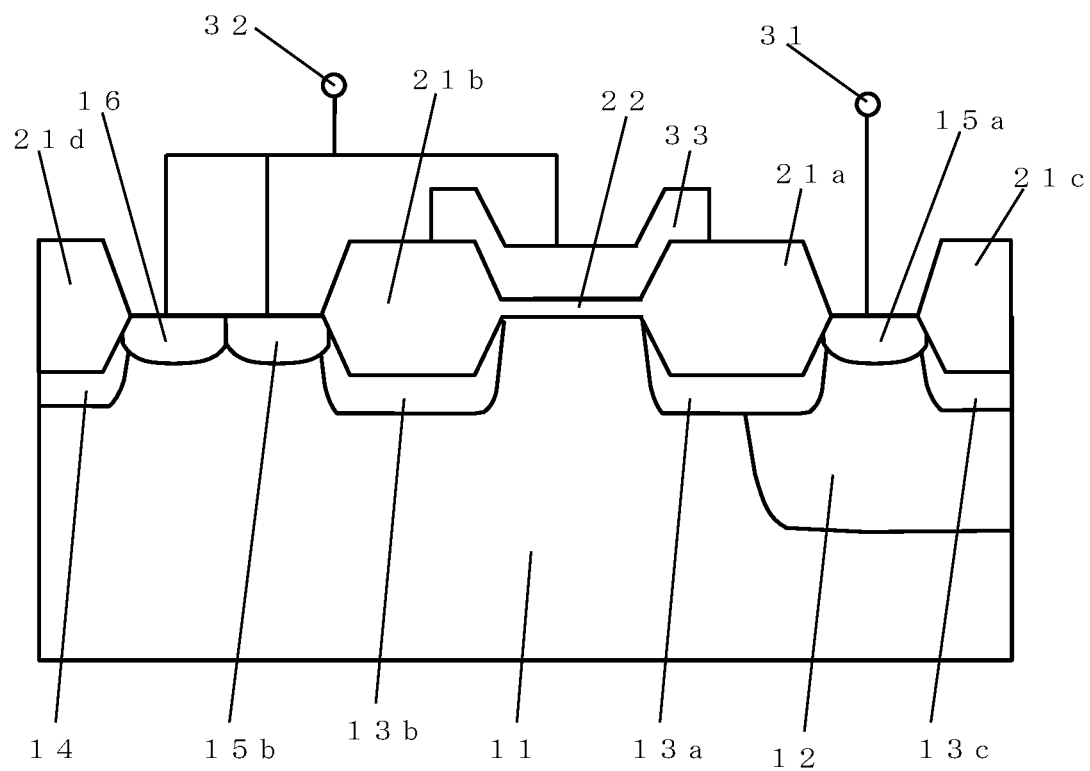
FIG. 4 is a schematic sectional view for illustrating still another semiconductor device of the related art.

An embodiment of the present invention is described below with reference to the drawings. FIG. 1 is a view of a semiconductor device according to the present invention. As illustrated in FIG. 1, a gate insulating film 22 is formed on a P-type semiconductor substrate 11, and a gate electrode 33 is formed on the gate insulating film 22. LOCOS oxide films 21a and 21b are formed at the respective ends of the gate electrode 33. A first N-type low concentration diffusion layer 13a of a drain is formed under the LOCOS oxide film 21a and serves as an offset layer for easing the electric field concentration. An N-type high concentration diffusion layer 15a of the drain is formed so as to adjoin the first N-type low concentration diffusion layer 13a of the drain. The N-type high concentration diffusion layer 15a of the drain is connected to a drain electrode 31. A first N-type low concentration diffusion layer 13b of a source is an offset layer of the source and is formed under the LOCOS oxide film 21b. The first N-type low concentration diffusion layer 13b of the source is placed adjacent to an N-type high concentration diffusion layer 15b of the source.

A second N-type low concentration diffusion layer 17 is formed under the N-type high concentration diffusion layer 15a of the drain. A third N-type low concentration diffusion layer 18 is further formed under the second N-type low concentration diffusion layer 17. The second N-type low concentration diffusion layer 17 and the third N-type low concentration diffusion layer 18 may overlap in plan view with the first N-type low concentration diffusion layer 13a which is in contact with the N-type high concentration diffusion layer 15a of the drain. The second N-type low concentration diffusion layer 17 and the third N-type low concentration diffusion layer 18 in the embodiment illustrated in FIG. 1 overlap with the first N-type low concentration diffusion layer 13a in contact with the N-type high concentration diffusion layer 15a of the drain.

The N-type high concentration diffusion layer 15b which serves as the source, the first N-type low concentration diffusion layer 13b which is an offset layer, and a P-type high concentration diffusion layer 16 which is used to acquire the potential of the P-type semiconductor substrate 11 are connected to a source-substrate electrode 32. The first N-type low concentration diffusion layer 13a formed under the LOCOS oxide film 21a is formed by ion implantation before the LOCOS oxide film is formed, and the dose and energy in the ion implantation are about 4 E12/cm2 and 40 keV. The conditions may be the same as those used for element isolation between internal elements.

The second N-type low concentration diffusion layer 17 and the third N-type low concentration diffusion layer 18 are desirably implanted with ions after the LOCOS oxide films are formed, in order to give the second N-type low concentration diffusion layer 17 and the third N-type low concentration diffusion layer 18 concentrations higher than the concentration of the first N-type low concentration diffusion layer 13a. The dose and energy in ion implantation for forming the second N-type low concentration diffusion layer 17 are desirably about 1 E12/cm2 to 4 E12/cm2 and about 300 keV to 500 keV. The dose for the third N-type low concentration diffusion layer 18 is about 5 E12/cm2 to 1 E13/cm2. The energy in ion implantation for forming the third N-type low concentration diffusion layer 18 is desirably 800 keV to 1,000 keV in order to implant ions at a depth that is approximately ¼ of the length (length in the horizontal direction) of the first N-type low concentration diffusion layer 13a. In the element structured as described above, the N-type high concentration diffusion layer 15b, the P-type high concentration diffusion layer 16, and the gate electrode 33 are electrically junctioned and connected to a Vss potential. The drain electrode 31 is connected to a Vdd supply terminal.

When noise having negative electric charges is applied to the Vdd supply terminal, a forward bias is generated in a P-N junction between the drain electrode 31 and the P-type semiconductor substrate 11, and the internal elements are protected by releasing the electric charges of the noise to the Vss potential.

When noise having positive electric charges is applied to the Vdd supply terminal, on the other hand, primary breakdown occurs in a P-N junction between the first N-type low concentration diffusion layer 13a, which is in contact with a channel under an end of the gate electrode 33, and the P-type semiconductor substrate 11, and electrons begin to be generated in the P-type semiconductor substrate 11. The electrons generated in the P-type semiconductor substrate 11 pass through an N-type region that has the highest concentration. The electrons first pass through the first N-type low concentration diffusion layer 13a which is formed under the LOCOS oxide film 21a, but then the path of the electrons to the drain electrode 31 shifts from a portion near the surface of the first N-type low concentration diffusion layer 13a to the third N-type low concentration diffusion layer 18 which is formed deep inside the P-type semiconductor substrate 11 and which is set to a concentration higher than that of the first N-type low concentration diffusion layer 13a.

As a result, electrons are prevented from concentrating at a border between the high concentration region on the surface of the first N-type low concentration diffusion layer 13a and the N-type high concentration diffusion layer 15a. The electric field concentration can be eased more than at the border between the first N-type low concentration diffusion layer 13a and the N-type high concentration diffusion layer 15a when the secondary breakdown occurs in a P-N junction between the third N-type low concentration diffusion layer 18 and the P-type semiconductor substrate 11. Through formation of the third N-type low concentration diffusion layer 18, the problem in that the hold voltage drops to a very low level is eliminated, and the hold voltage can be maintained at a voltage equal to or higher than the operating voltage. Through formation of the third N-type low concentration diffusion layer 18, the need to maintain the hold voltage after the primary breakdown is also eliminated, which means that the W length does not need to be lengthened. In other words, the present invention also has an effect of keeping the element size small.

Figure 5:
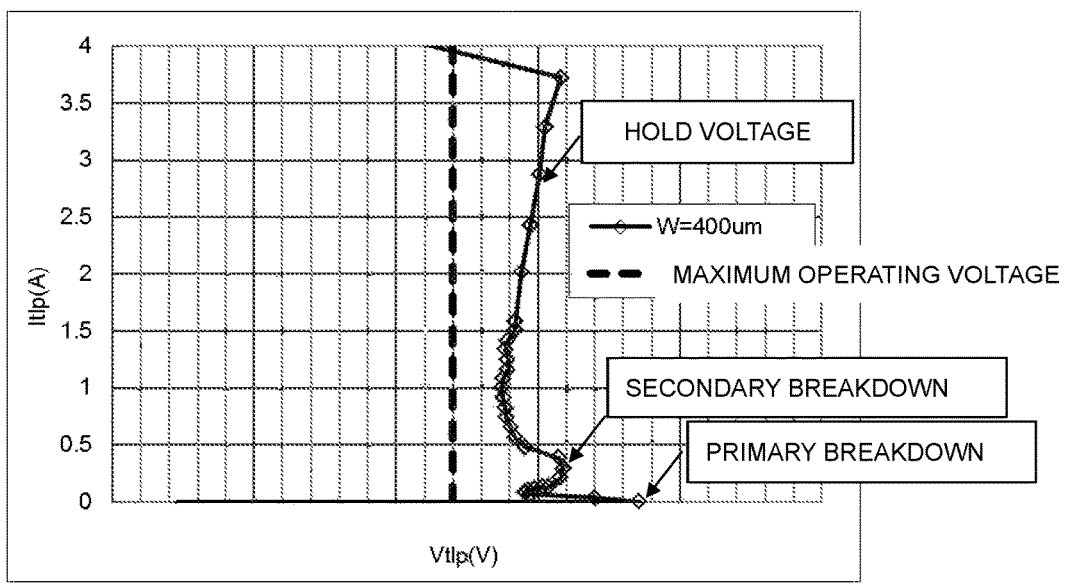
FIG. 5 is a graph of a TLP current-voltage waveform of the semiconductor device according to the embodiment of the present invention.
Figure 6:
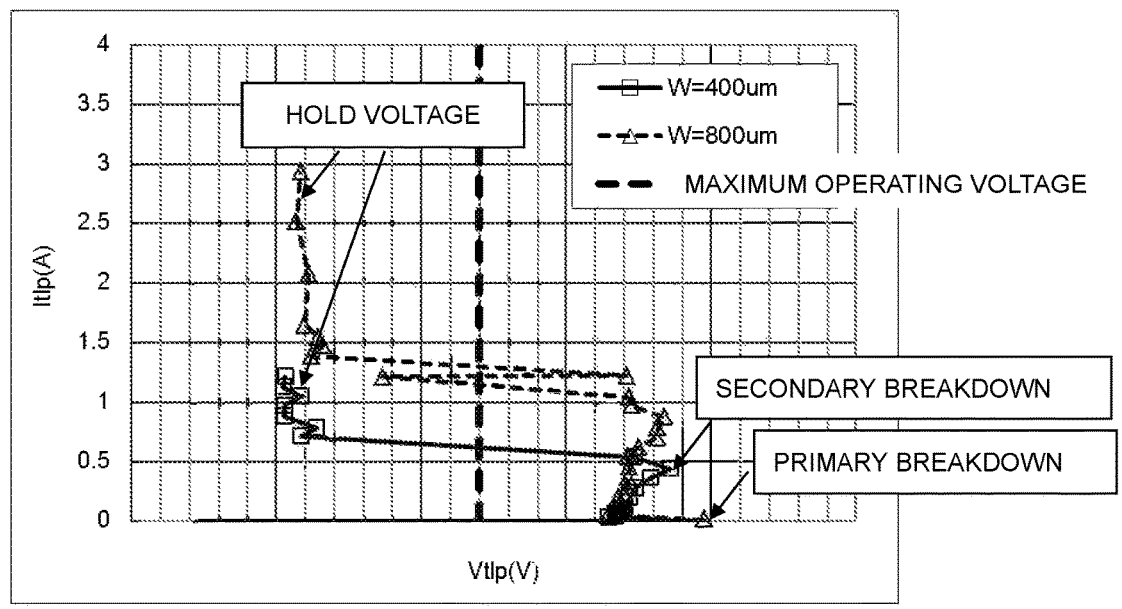
FIG. 6 is a graph of a TLP current-voltage waveform of the semiconductor device of the related art.

The second N-type low concentration diffusion layer 17 is set to a concentration equal to or higher than that of the first N-type low concentration diffusion layer 13a in order to make the movement of electrons from the third N-type low concentration diffusion layer 18 to the drain electrode more dominant than the movement of electrons from the first N-type low concentration diffusion layer 13a to the drain electrode. The result of measuring a TLP current-voltage waveform of the semiconductor device according to the embodiment of the present invention is shown in FIG. 5, as in FIG. 6, which is a graph for showing the TLP current-voltage waveform of the semiconductor device of the related art. The waveform proves that the structure of this embodiment is capable of raising the hold voltage to a level equal to or higher than the operating voltage, and relieving noise without increasing the element size even when noise having a large amount of positive electric charge is applied to the Vdd supply terminal, compared to the semiconductor device structure of the related art.

What is claimed is:

1. A semiconductor device, comprising:
    a P-type semiconductor substrate;
    a gate insulating film on a surface of the P-type semiconductor substrate;
    a gate electrode on the gate insulating film;
    a LOCOS oxide film on the surface of the P-type semiconductor substrate at each end of the gate electrode;
    a source region and a drain region each having a first N-type low concentration diffusion layer, the first N-type low concentration diffusion layers under the LOCOS oxide films;
    the source region and the drain region each further having an N-type high concentration diffusion layer, the N-type high concentration diffusion layer of the source region in contact with the first N-type low concentration diffusion layer of the source region on a first opposite side from the gate insulating film, and the N-type high concentration diffusion layer of the drain region in contact with the first N-type low concentration diffusion layer of the drain region on a second opposite side from the gate insulating film;
    a second N-type low concentration diffusion layer under and in contact with the first N-type low concentration diffusion layer of the drain region and the N-type high concentration diffusion layer of the drain region; and
    a third N-type low concentration diffusion layer under and in contact with the second N-type low concentration diffusion layer.

2. A semiconductor device according to claim 1, wherein the third N-type low concentration diffusion layer has a concentration higher than a concentration of the first N-type low concentration diffusion layer and higher than a concentration of the second N-type low concentration diffusion layer, and
    wherein the concentration of the second N-type low concentration diffusion layer is equal to or higher than the concentration of the first N-type low concentration diffusion layer of the drain.

3. A semiconductor device according to claim 1, wherein the third N-type low concentration diffusion layer is at a depth that is ¼ of a length in a horizontal direction of the first N-type low concentration diffusion layers.

4. A semiconductor device according to claim 2, wherein the third N-type low concentration diffusion layer is at a depth that is ¼ of a length in a horizontal direction of the first N-type low concentration diffusion layers.

* * * * *